(12) United States Patent
Ragupathi et al.

(10) Patent No.: US 9,681,577 B2
(45) Date of Patent: Jun. 13, 2017

(54) SYSTEM AND METHOD FOR IMPROVING FAN LIFE IN AN INFORMATION HANDLING SYSTEM

(71) Applicant: Dell Products, LP, Round Rock, TX (US)

(72) Inventors: Dinesh K. Ragupathi, Round Rock, TX (US); Alaric Silveira, Austin, TX (US); Carlos G. Henry, Round Rock, TX (US); Thanh Hung Dang, Austin, TX (US); Hasnain Shabbir, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 310 days.

(21) Appl. No.: 14/326,274

(22) Filed: Jul. 8, 2014

(65) Prior Publication Data

US 2015/0373877 A1   Dec. 24, 2015

Related U.S. Application Data

(63) Continuation of application No. 14/310,195, filed on Jun. 20, 2014.

(51) Int. Cl.
*H05K 7/20* (2006.01)
*G06F 1/20* (2006.01)
*F04D 25/06* (2006.01)
*F04D 27/00* (2006.01)
*G05B 23/02* (2006.01)

(52) U.S. Cl.
CPC ..... *H05K 7/20136* (2013.01); *F04D 25/0613* (2013.01); *F04D 27/001* (2013.01); *F04D 27/005* (2013.01); *G05B 23/0289* (2013.01); *G06F 1/206* (2013.01); *H05K 7/20209* (2013.01); *H05K 7/20718* (2013.01); *H05K 7/20836* (2013.01); *F05D 2270/11* (2013.01)

(58) Field of Classification Search
CPC ........... H05K 7/20136; H05K 7/20209; H05K 7/20718; G05B 23/028; F04D 27/001; F04D 27/0005; F04D 25/0613; G06F 1/206; F05D 2270/11
See application file for complete search history.

(56) References Cited

U.S. PATENT DOCUMENTS

| | | | |
|---|---|---|---|
| 4,326,193 A | 4/1982 | Markley et al. | |
| 5,808,861 A | 9/1998 | Nakajima et al. | |
| 6,723,933 B2 | 4/2004 | Haag et al. | |
| 7,995,340 B2 * | 8/2011 | Peter | H05K 7/20209 361/695 |
| 2005/0040972 A1 | 2/2005 | Hamada et al. | |
| 2005/0264539 A1 | 12/2005 | Nakamura | |
| 2007/0139395 A1 | 6/2007 | Westerman et al. | |
| 2007/0199804 A1 | 8/2007 | Joseph et al. | |

(Continued)

*Primary Examiner* — Nathan L Laughlin
(74) *Attorney, Agent, or Firm* — Larson Newman, LLP (57) ABSTRACT

An information handling system includes a first fan in a first location for cooling a first component of the information handling system, a second fan in a second location for cooling a second component of the information handling system, and a management controller. The management controller determines that the first fan has experienced greater stress than the second fan, and recommends that the first fan be placed in the second location and that the second fan be placed in the first location.

18 Claims, 8 Drawing Sheets

(56) References Cited

U.S. PATENT DOCUMENTS

| | | | |
|---|---|---|---|
| 2010/0094593 A1* | 4/2010 | Reddy | G06F 11/3058 702/183 |
| 2010/0103609 A1 | 4/2010 | Bhutani et al. | |
| 2012/0140402 A1* | 6/2012 | Mizumura | H05K 7/20836 361/679.33 |
| 2013/0054047 A1* | 2/2013 | Uhlmann | G06F 1/206 700/300 |
| 2014/0086761 A1* | 3/2014 | Abe | F04D 19/007 417/338 |
| 2015/0077924 A1* | 3/2015 | Rauline | H05K 7/1489 361/679.39 |

* cited by examiner

| Fan Zone<br>HW | 110 | 120 | 130 | 140 | 150 | 160 |
|---|---|---|---|---|---|---|
| 170 – CPU1 |  | X |  |  |  |  |
| 172 – CPU2 |  |  |  |  | X |  |
| 174 – PCH |  |  |  | X |  |  |
| 176 – DIMM | X |  |  |  |  |  |
| 178 – DIMM |  |  | X |  |  |  |
| 180 – DIMM |  |  |  | X |  |  |
| 182 – DIMM |  |  |  |  |  | X |
| 184 – RC | X | X |  |  |  |  |
| 186 – NDC |  |  | X |  |  |  |
| 188 – PSU |  |  |  | X | X | X |

SYSTEM AND METHOD FOR IMPROVING FAN LIFE IN AN INFORMATION HANDLING SYSTEM

CROSS REFERENCE TO RELATED APPLICATIONS

This application is a continuation of U.S. patent application Ser. No. 14/310,195, entitled "System for Improving Fan Life in an Information Handling System," filed on Jun. 20, 2014, the disclosure of which is hereby expressly incorporated by reference in its entirety.

FIELD OF THE DISCLOSURE

This disclosure generally relates to information handling systems, and more particularly relates to improving fan life in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems. An information handling system can include one or more fans to cool the components of the information handling system.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
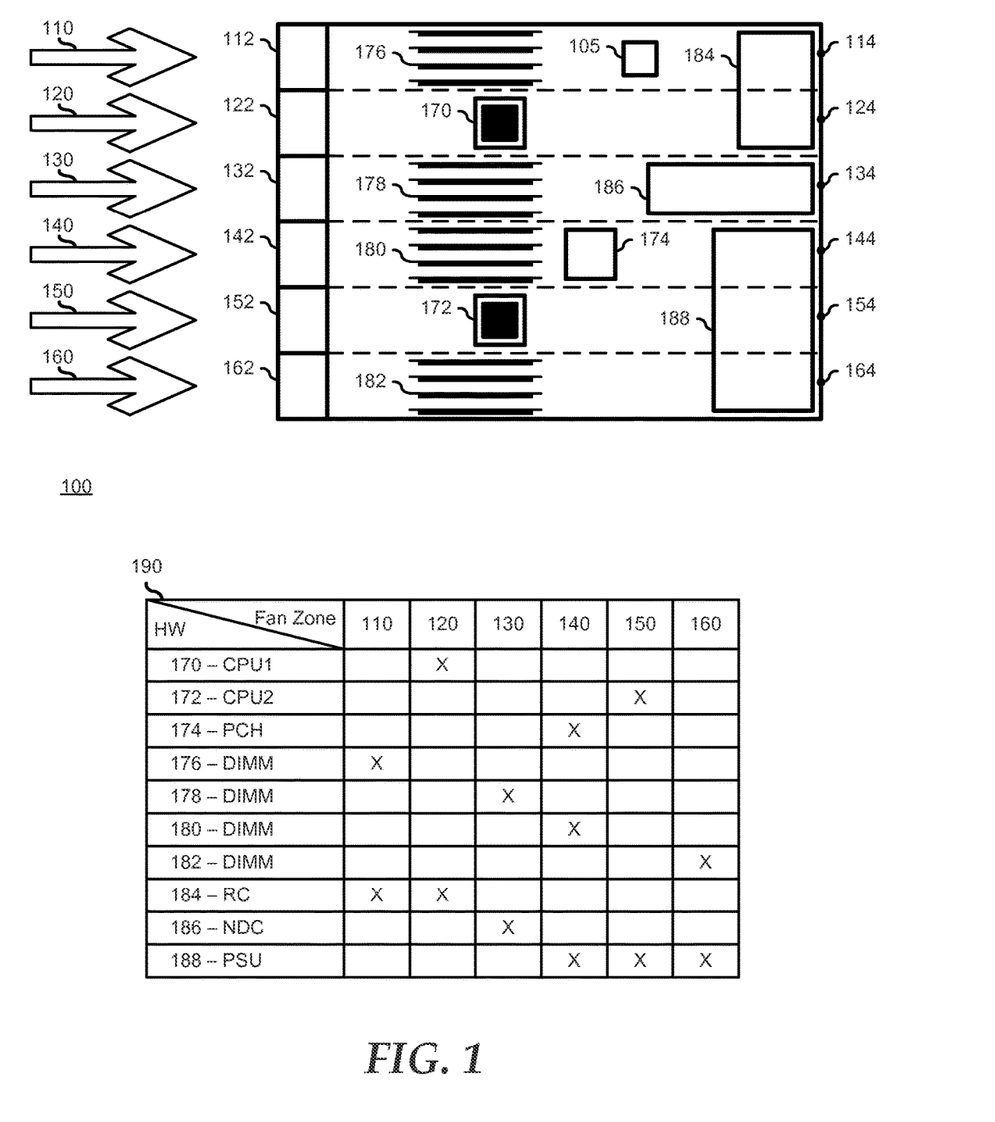
FIG. 1 is a block diagram of a server system, according to an embodiment of the present disclosure.

FIG. 1 illustrates a server system 100 that can be implemented on one or more information handling system. For purposes of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An example of an information handling system includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Server system 100 includes processors 170 and 172, a platform controller hub (PCH) 174, memory 176, 178, 180, and 182, a RAID controller (RC) 184, a network daughter card (NDC) 186, and a power supply unit 188. Server system 100 is arranged into fan zones 110, 120, 130, 140, 150, and 160 for providing directed cooling to the components of the server system. Thus, as shown in zone map 190, fan zone 110 includes memory 176 and a portion of RC 184, fan zone 120 includes processor 170 and another portion of RC 184, fan zone 130 includes memory 178 and NDC 186, fan zone 140 includes memory 180, PCH 174, and a portion of PSU 188, fan zone 150 includes processor 172 and another portion of PSU 188, and fan zone 160 includes memory 182 and another portion of PSU 188. Each of fan zones 110, 120, 130, 140, 150, and 160 includes a respective fan 112, 122, 132, 142, 152, and 162, and a respective temperature sensor 114, 124, 134, 144, 154, and 164.

Server system 100 also includes a management controller 105 operable to determine the cooling needs within each of fan zones 110, 120, 130, 140, 150, and 160, and to adjust the operating speed of respective fans 112, 122, 132, 142, 152, and 162 to provide the cooling demanded by the components in the fan zones. In a particular embodiment, temperature sensors 114, 124, 134, 144, 154, and 164 a located at an exhaust for respective fan zones 110, 120, 130, 140, 150, and 150. Here, management controller 105 receives temperature readings from temperature sensors 114, 124, 134, 144, 154, and 164 and determines the cooling needs within respective fan zones 110, 120, 130, 140, 150, and 160 based upon the temperature readings. In another embodiment, server system 100 can include one or more temperature sensors (not shown) at the inlet ends of fan zones 110, 120, 130, 140, 150, and 160, and management controller 105 determines a difference between the temperature readings from temperature sensors 114, 124, 134, 144, 154, and 164 and the temperature readings from the inlet temperature sensors to determine the cooling needs within each of fan zones 110, 120, 130, 140, 150, and 160. In another embodiment, management controller 105 operates to receive temperature readings from one or more of processors 170 and 172, PCH 174, memory 176, 178, 180, and 182, RC 184, NDC 186, and power supply unit 188. These temperature readings can be used to determine the cooling needs within fan zones 110, 120, 130, 140, 150, and 160, or these temperature readings can be used in conjunction with the temperature readings from temperature sensors 114, 124, 134, 144, 154, and 164 to adjust the operating speeds of fans 112, 122, 132, 142, 152, and 162. Other methods of determine the cooling needs within fan zones of an information handling system are known in the art and will not be discussed further herein.

Based upon the operating conditions experienced by server system 100, each of fan zones 110, 120, 130, 140, 150, and 160 can have widely different cooling needs over time. For example, when server system 100 is operating a more processor centric load, fan zones 120 and 150 can demand greater cooling as compared with fan zones 110, 130, 140, and 160, or when the server system is operating a more memory centric load, fan zones 110, 130, 140 and 160 can demand greater cooling as compared with fan zones 120 and 140. As such, each of fans 112, 122, 132, 142, 152, and 162 can experience widely different amounts of stress over the life of server system 100.

Management controller 105 operates to determine the stress on fans 112, 122, 132, 142, 152, and 162, and to provide recommendations for swapping fans that have experienced greater stress with fans that have experienced less stress. The stress on fans 112, 122, 132, 142, 152, and 162 can be determined as a function of the efficiency of each fan. In particular, management controller 105 operates to determine an initial efficiency for each fan 112, 122, 132, 142, 152, and 162 when the fans are installed into server system 100, and to periodically re-determine the efficiency of each fan. Management controller 105 then provides recommendations for swapping fans based upon the initially determined efficiency and the re-determined efficiency of each fan 112, 122, 132, 142, 152, and 162. In a particular embodiment, management controller 105 includes the ability to determine the aggregate power consumed by all of the fans. Here, management controller 105 operates to determine the efficiency of a particular fan by turning off all fans except for the particular fan and measuring the power consumed by the particular fan at various speed settings.

The recommendation to swap a fan that has experienced greater stress with a fan that has experienced less stress is made at various times and for various reasons. In particular, a recommendation to swap fans can be made when server system 100 is placed into a service mode, such that a technician is already working on the server system. A recommendation can also be made when one or more fan has dropped below an efficiency threshold, or when the difference in efficiency between two fans has exceeded a threshold. Finally, a recommendation can be made when a recommendation period has expired. In a particular embodiment, after a technician swaps two or more fans, management controller 105 operates to track the swapped fans such that, at the next recommendation, the fans originally swapped are not swapped back into their previous locations.

Figure 2:
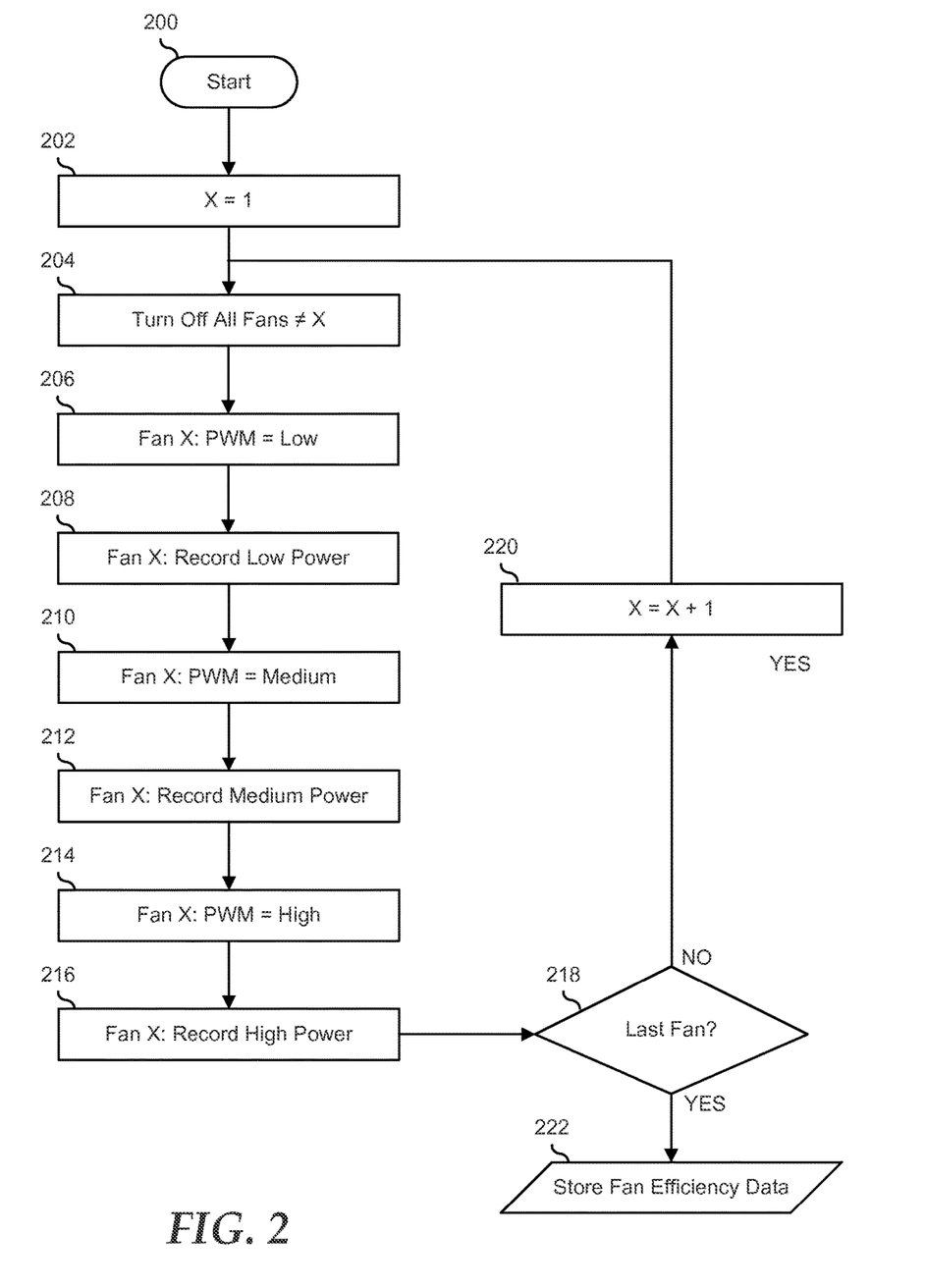
FIG. 2 is a flow chart illustrating a method of determining the efficiency of fans in a server system, according to an embodiment of the present disclosure.

FIG. 2 illustrates a method of determining the efficiency of fans in a server system, starting at block 200. In block 202, a first fan is selected. All fans except the selected fan are turned off in block 204. The selected fan is set to operate at a low speed in block 206 and the power consumed by the selected fan at the low speed is recorded in block 208. The selected fan is set to operate at a medium speed in block 210 and the power consumed by the selected fan at the medium speed is recorded in block 212. The selected fan is set to operate at a high speed in block 214 and the power consumed by the selected fan at the high speed is recorded in block 216. A decision is made as to whether or not the selected fan is the last fan in decision block 218. If not, the "NO" branch of decision block 218 is taken, a next fan is selected in block 220, and the method returns to block 204, where all fans except the newly selected fan are turned off. If the selected fan is the last fan, the "YES" branch of decision block 218 is taken and the fan efficiency data is stored for use in making a recommendation to swap fans in block 222.

The above method of determining the efficiency of fans in a server system can be performed to determine the initial efficiency of the fans, and for re-determining the efficiency of the fans. In a particular embodiment, each measurement of the power consumed by a particular fan can be followed by turning all of the fans back on and then turning all but the selected fan back off. For example, when a server is in a normal operating mode, it may not be desirable to turn off all but one fan for such a duration as may be needed to record all of the efficiency information. As such, it may be desirable to only turn off the non-selected fans for a duration necessary to record just one efficiency at just one selected fan speed, and then to restore all fans to normal operation for a time, before recording another efficiency at another fan speed or for another fan. Moreover, more or less than three speed settings can be utilized, as needed or desired.

Figure 3:
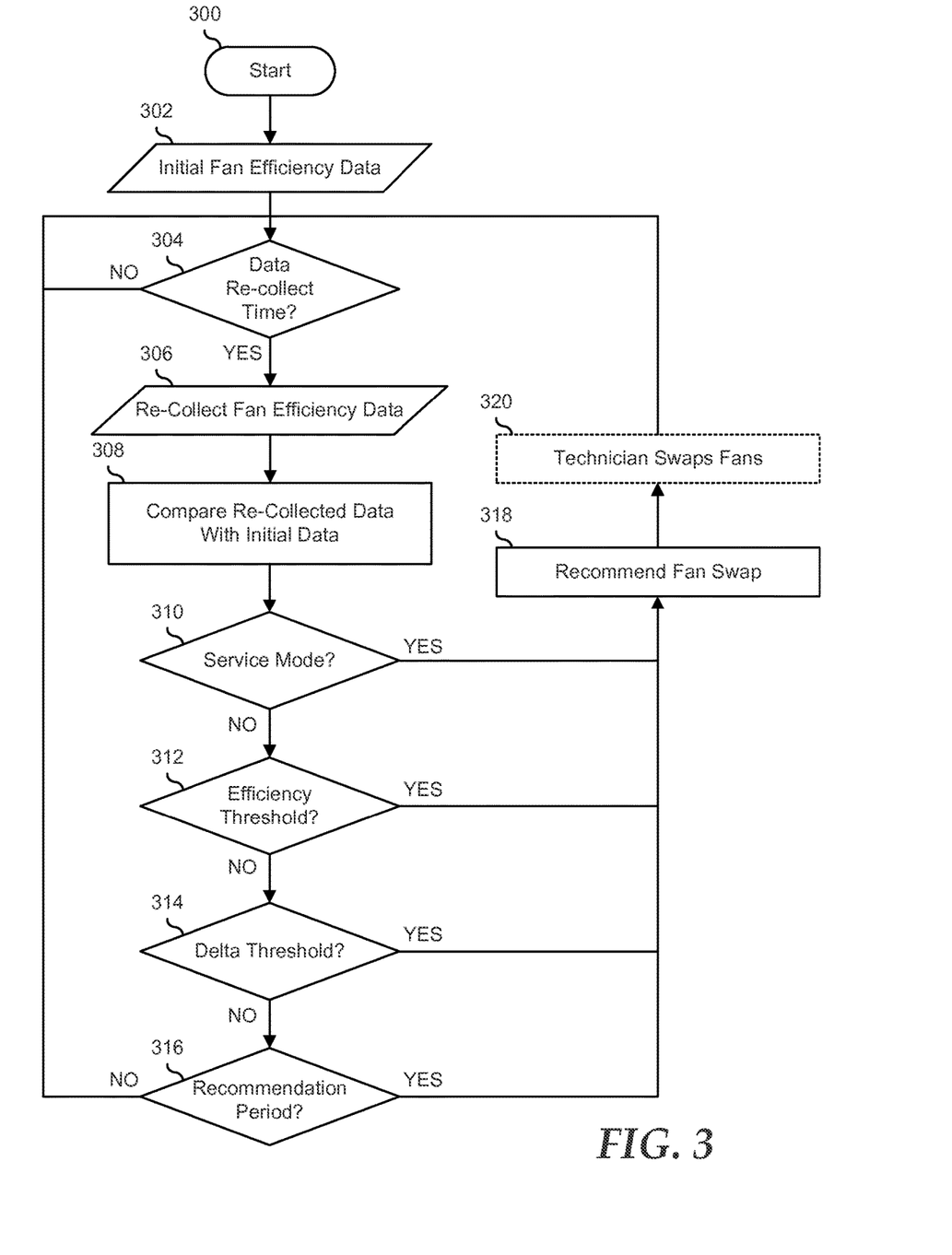
FIG. 3 is a flow chart illustrating a method for providing recommendations for swapping fans based upon the efficiencies of the fans, according to an embodiment of the present disclosure.

FIG. 3 illustrates a method for providing recommendations for swapping fans based upon the efficiencies of the fans, starting at block 300. Initial fan efficiency data is collected in block 302, such as by the method of FIG. 2. A decision is made as to whether or not it is time to periodically re-determine the efficiency of the fans in decision block 304. If not, the "NO" branch of decision block 304 is taken and the method loops back to decision block 304 until it is time to periodically re-determine the efficiency of the fans, at which point the "YES" branch of decision block 304 is taken and the fan efficiency data is re-collected in block 306, such as by the method of FIG. 2. The recollected data is compared with the initial data in block 308. The comparison of block 308 operates to determine if one or more particular fan is degrading in terms of efficiency at a faster rate than the other fans.

A decision is made as to whether the server system has entered a service mode in decision block 310, such as when a technician is working on the server system. If not, the "NO" branch of decision block 310 is taken and a decision is made as to whether or not any of the fans have dropped below an efficiency threshold in decision block 312. If not, the "NO" branch of decision block 312 is taken and a decision is made as to whether or not the difference in efficiency between any two fans has exceeded a threshold in decision block 314. If not, the "NO" branch of decision block 314 is taken and a decision is made as to whether or not a recommendation period has expired in decision block 316. If not, the "NO" branch of decision block 316 is taken and the method returns to decision block 304 where the method loops until a next data re-collection time.

If either the server system has entered a service mode in decision block 310, any of the fans have dropped below an efficiency threshold in decision block 312, the difference in efficiency between any two fans has exceeded a threshold in decision block 314, or a recommendation period has expired in decision block 316, the respective decision block "YES" branch is taken and a recommendation is made to swap the fans in block 318. A technician swaps the fans in block 320 and the method returns to decision block 304 where the method loops until a next data re-collection time.

Returning to FIG. 1, the stress on fans 112, 122, 132, 142, 152, and 162 can also be determined as a function of the usage of each fan. Here, management controller 105 operates to determine an accumulated usage for each fan 112, 122, 132, 142, 152, and 162 from the time when the fans are installed into server system 100. Management controller 105 then provides recommendations for swapping fans based upon accumulated usage of each fan 112, 122, 132, 142, 152, and 162. In a particular embodiment, management controller 105 includes the ability to determine the speed of each fan in revolutions per minute (RPM) and, as noted above, the temperature of the inlet air received by each fan. In a particular embodiment, the usage of a particular fan is determined every second as:

$$FanUsage = \sum_{0}^{N} \left( \frac{RPM}{60 \frac{\sec}{\min}} \times \frac{T_{Inlet} + T_{Rise}}{60° \text{ C.}} \right) \quad \text{Equation 1}$$

where N is the time since the fan was new, $T_{Inlet}$ is the inlet temperature, and TRise is the rise in temperature from the inlet to the exhaust. Thus the fan usage is determined each second as the number of revolutions of the fan during that second multiplied by a factor accounting for the temperature experienced by the fan. As with the recommendations based upon fan efficiency, here, the recommendation to swap a fan that has greater usage with a fan that has less usage is made based upon a service mode, a usage threshold, a difference in usage between fans, and a recommendation period.

Figure 4:
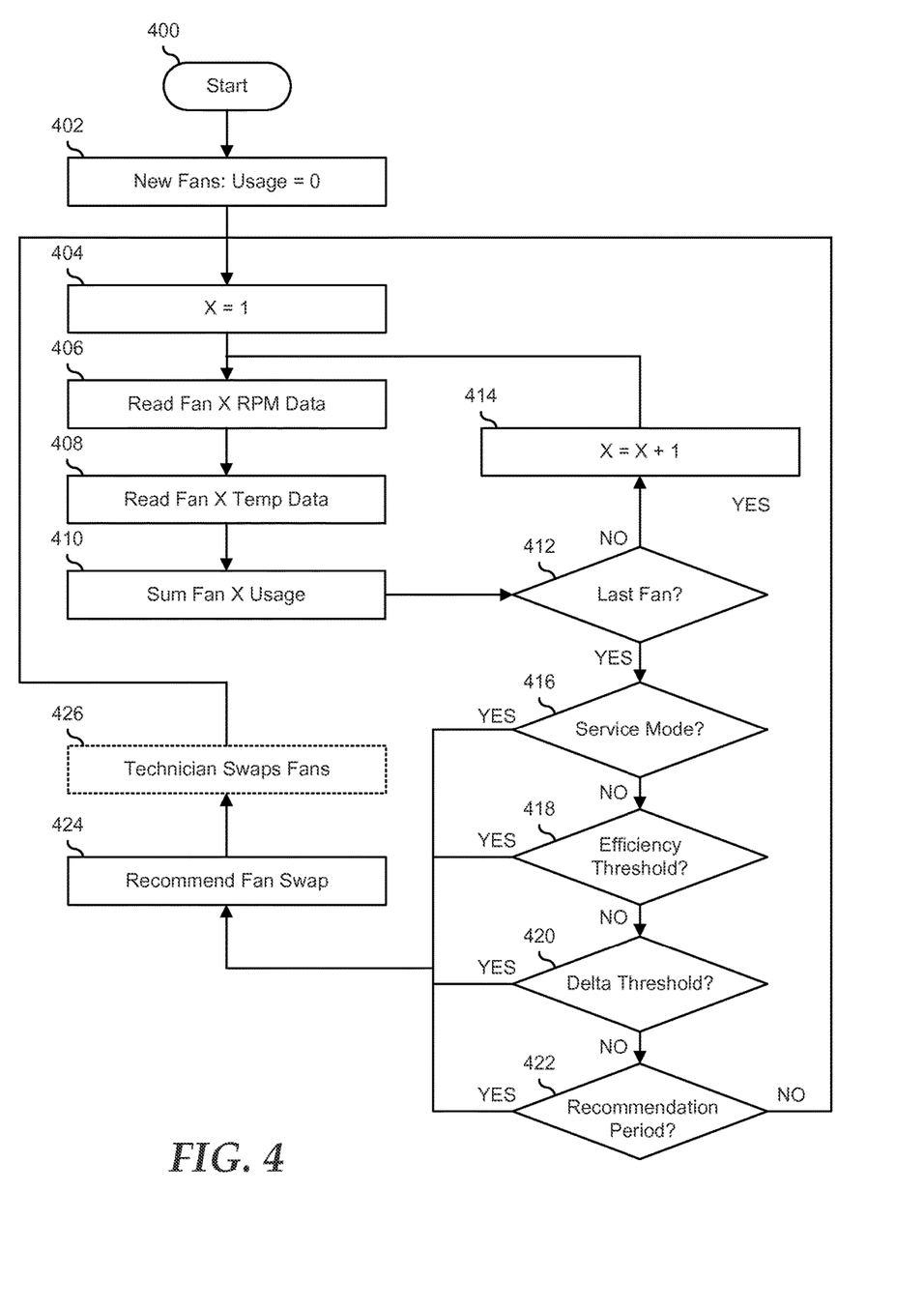
FIG. 4 is a flow chart illustrating a method of determining the usage of fans in a server system and for providing recommendations for swapping fans based upon the usages of the fans, according to an embodiment of the present disclosure.

FIG. 4 illustrates a method of determining the usage of fans in a server system and for providing recommendations for swapping fans based upon the usages of the fans, starting at block 400. In block 402, new fans are installed in a server system and the fan usage for each fan is set to zero. A first fan is selected in block 404. The speed of the selected fan is read in block 406, and the temperature information at the inlet and exhaust of the associated fan zone is read in block 408. The usage for the selected fan is determined in block 410. For example, the fan usage can be determined via equation 1. A decision is made as to whether or not the selected fan is the last fan in decision block 412. If not, the "NO" branch of decision block 412 is taken, a next fan is selected in block 414, and the method returns to block 406, where the speed of the newly selected fan is read.

If the selected fan is the last fan, the "YES" branch of decision block 412 is taken and a decision is made as to whether or not the server system has entered a service mode in decision block 416. If not, the "NO" branch of decision block 416 is taken and a decision is made as to whether or not any of the fans have exceeded a usage threshold in decision block 418. If not, the "NO" branch of decision block 418 is taken and a decision is made as to whether or not the difference in usage between any two fans has exceeded a threshold in decision block 420. If not, the "NO" branch of decision block 314 is taken and a decision is made as to whether or not a recommendation period has expired in decision block 422. If not, the "NO" branch of decision block 422 is taken and the method returns to decision block 404 where a first fan is selected.

If either the server system has entered a service mode in decision block 416, any of the fans have exceeded a usage threshold in decision block 418, the difference in usage between any two fans has exceeded a threshold in decision block 420, or a recommendation period has expired in decision block 422, the respective decision block "YES" branch is taken and a recommendation is made to swap the fans in block 424. A technician swaps the fans in block 426 and the method returns to block 404 where a first fan is selected.

In a particular embodiment, the fan efficiency information, the fan usage information, and the recommendation to swap fans can be provided via a graphical user interface, such as a management page of a management controller interface, or at a management system that communicates with a number of management controllers in server systems in a data center. As such, where a server system has provided a recommendation to swap fans, it may be difficult to determine whether or not the fans have actually been swapped. In particular, this problem relates to the fact that many systems do not include any way to identify one instantiation of a fan from another because the fans include no electrical way to identify themselves.

Figure 5:
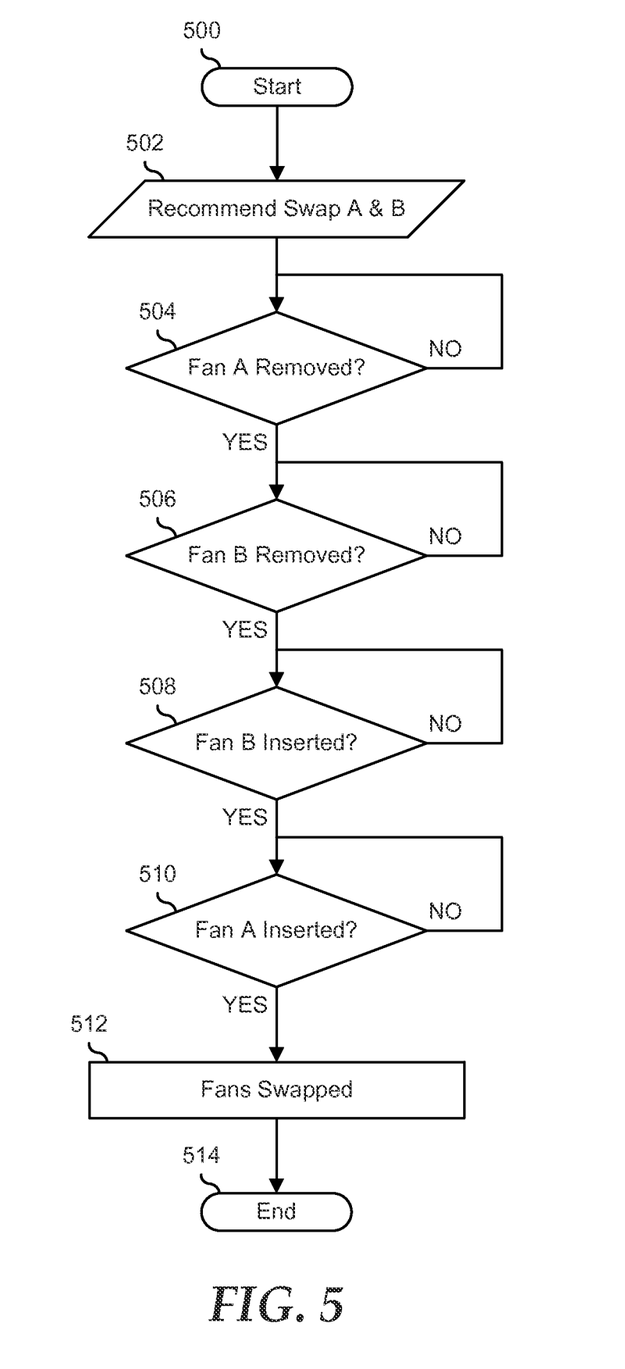
FIG. 5 is a flow chart illustrating a method for determining that fans have been swapped in a server system, according to an embodiment of the present disclosure.

FIG. 5 illustrates a method for determining that fans have been swapped in a server system, starting at block 500. A recommendation is made to swap a first fan, Fan A, with a second fan, Fan B, in block 502. A decision is made as to whether or not Fan A has been removed in decision block 504. In a particular embodiment, the determination that Fan A has been removed or not is based upon the detection by a management controller of a fan failure in the fan slot that includes Fan A. That is, when the management controller detects a fan failure in the fan slot that includes Fan A in conjunction with the fact that the management controller has provided a recommendation to swap Fan A with Fan B, then the management controller infers that Fan A has been removed. If Fan A has not been removed, the "NO" branch of decision block 504 is taken and the method loops back to decision block 504 until Fan A has been removed, then the "YES" branch of decision block 504 is taken and a decision is made as to whether or not Fan B has been removed in decision block 506. Here, the determination that Fan B has been removed or not is based upon the detection by the management controller of a fan failure in the fan slot that includes Fan B, and the management controller infers that Fan B has been removed. If Fan B has not been removed, the "NO" branch of decision block 506 is taken and the method loops back to decision block 506 until Fan B has been removed, then the "YES" branch of decision block 506 is taken and a decision is made as to whether or not Fan B has been inserted in decision block 508. Here, the determination that Fan B has been inserted or not is based upon the detection by the management controller of the de-assertion of the fan failure in the fan slot that formerly included Fan A. That is, when the management controller detects a de-assertion of the fan failure in the fan slot that included Fan A in conjunction with the fact that the management controller has provided a recommendation to swap Fan A with Fan B, then the management controller infers that Fan B has been installed. If Fan B has not been inserted, the "NO" branch of decision block 508 is taken and the method loops back to decision block 508 until Fan B has been inserted, then the "YES" branch of decision block 508 is taken and a decision is made as to whether or not Fan A has been inserted in decision block 510. Here, the determination that Fan A has been inserted or not is based upon the detection by the management controller of the de-assertion of the fan failure in the fan slot that included Fan B, and the management controller infers that Fan A has been inserted. If Fan A has not been inserted, the "NO" branch of decision block 510 is taken and the method loops back to decision block 510 until Fan A has been inserted, then the "YES" branch of decision block 510 is taken, the management controller determines that Fan A has been swapped with Fan B in block 512, and the method ends in block 514.

Figure 6:
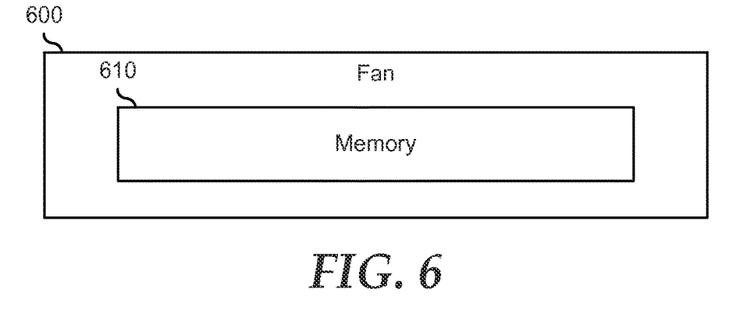
FIG. 6 is a block diagram illustrating a fan that includes a persistent read/writable memory, according to an embodiment of the present disclosure.

FIG. 6 illustrates a fan 600 including a persistent read/writable memory 610, such as a non-volatile random access memory (NVRAM). Fan 600 is similar to fans 112, 122, 132, 142, 152, and 162, and operates to provide cooling to the components in a fan zone of a server system. Here, fan 600 operates to receive information from a management controller of the server system that positively identifies fan 600 relative to other instantiations of fans similar to fan 600 in the server system. In a particular embodiment, the management controller writes a unique identifier into memory 610, and writes different identifiers into the other memories of the other fans in the server system. In another embodiment, the management controller writes efficiency information for fan 600, usage information for the fan, or both into memory 610, and writes the efficiency and usage information for the other fans into the memories of the other fans in the server system. In this way, the management controller can positively identify each fan in the server system.

Figure 7:
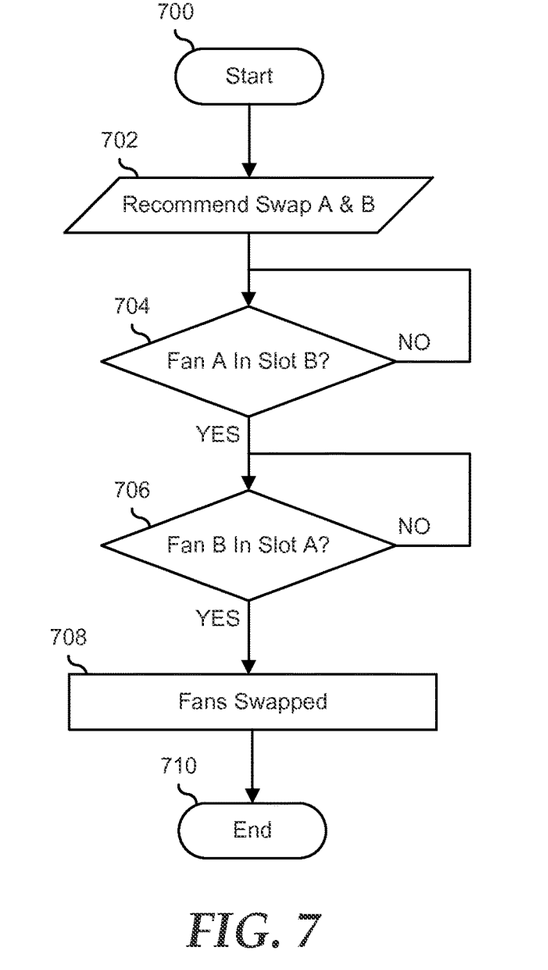
FIG. 7 is a flow chart illustrating a method for determining that fans have been swapped in a server system that includes fans similar to the fan of FIG. 6.

FIG. 7 illustrates a method for determining that fans have been swapped in a server system that includes fans similar to fan 600, starting at block 700. A recommendation is made to swap a first fan, Fan A, with a second fan, Fan B, in block 702. A decision is made as to whether or not Fan A has been installed into the fan slot associated with Fan B in decision block 704. Here, the determination that Fan A has been installed into the fan slot associated with Fan B is based upon reading the memory of the fan inserted into the fan slot associated with Fan B, and determining from the information read from the memory, that the fan presently inserted into the fan slot is Fan A. If Fan A has not been inserted into the fan slot associated with Fan B, the "NO" branch of decision block 704 is taken and the method loops back to decision block 704 until Fan A has been inserted into the fan slot associated with Fan B, then the "YES" branch of decision block 704 is taken and decision is made as to whether or not Fan B has been installed into the fan slot associated with Fan A in decision block 706. Here, the determination that Fan B has been installed into the fan slot associated with Fan A is based upon reading the memory of the fan inserted into the fan slot associated with Fan A, and determining from the information read from the memory, that the fan presently inserted into the fan slot is Fan B. If Fan B has not been inserted into the fan slot associated with Fan A, the "NO" branch of decision block 706 is taken and the method loops back to decision block 706 until Fan B has been inserted into the fan slot associated with Fan A, then the "YES" branch of decision block 706 is taken, the management controller determines that Fan A has been swapped with Fan B in block 708, and the method ends in block 710.

Figure 8:
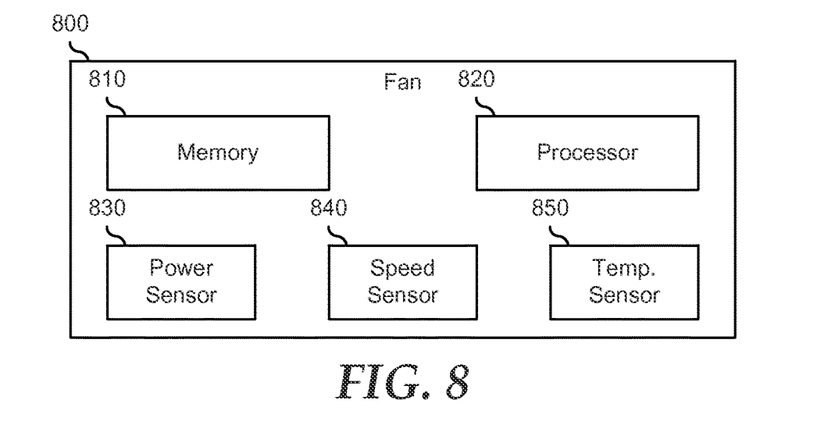
FIG. 8 is a block diagram illustrating a fan including a persistent read/writable memory, a processor, a power sensor, a speed sensor, and a temperature sensor, according to an embodiment of the present disclosure.

FIG. 8 illustrates a fan 800 including a persistent read/writable memory 810, such as a NVRAM, a processor 820, a power sensor 830, a speed sensor 840, and a temperature sensor 850. Fan 800 is similar to fans 112, 122, 132, 142, 152, and 162, and operates to provide cooling to the components in a fan zone of a server system. Memory 810 can include code that is executable by processor 820 to perform various operations related to the operations of fan 800. In particular, fan 800 operates to determine the initial efficiency for the fan, and to periodically re-determine the efficiency for the fan at a particular point in time. In determining the efficiency of fan 800, the code can operate to perform a method similar to the method of FIG. 2, where the power usage information is determined by power sensor 830. In another embodiment, fan 800 detects the power usage at various times from power sensor 830, and correlates the power usage information with the operating speed of the fan as determined from speed sensor 840. Fan 800 further operates to determine the usage for the fan. For example, fan 800 can receive speed information from speed sensor 840 and temperature information from temperature sensor 850, and can determine a usage based upon Equation 1, as described above.

Figure 9:
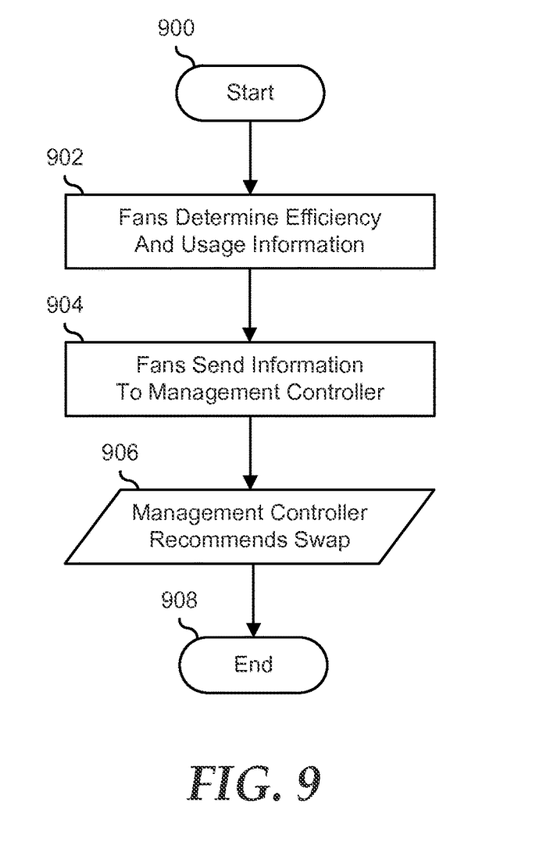
FIG. 9 is a flow chart illustrating a method for providing recommendations for swapping fans based upon the efficiencies and the usages of the fans similar to the fan of FIG. 8.

FIG. 9 illustrates a method for providing recommendations for swapping fans based upon the efficiencies and the usages of the fans where the fans are similar to fan 800, starting at block 900. Each fan determines its efficiency and usage information in block 902. Each fan provides the efficiency and usage information to a management controller in block 904, and the management controller provides recommendations to swap fan based upon the received information in block 906, and the method ends in block 908.

The skilled artisan will recognize that the configuration of a server system can vary greatly, in terms of the components in a fan zone, in terms of the location of the fans at the inlet end of the fan zone, at the exhaust end of the fan zone, or somewhere in between, in terms of the location and number of temperature sensors, and the like, and that the teachings herein are not limited to a specific configuration. Neither are the teachings herein limited to a server system, but are likewise applicable to other information handling systems. The skilled artisan will further understand that more than two fans in a system can be swapped, based upon the teachings herein. For example, where three fans are to be swapped, a fan with the highest usage can be placed into a lowest usage slot, the fan with the lowest usage can be placed into a medium usage slot, and a fan with medium usage can be placed into the highest usage slot.

Figure 10:
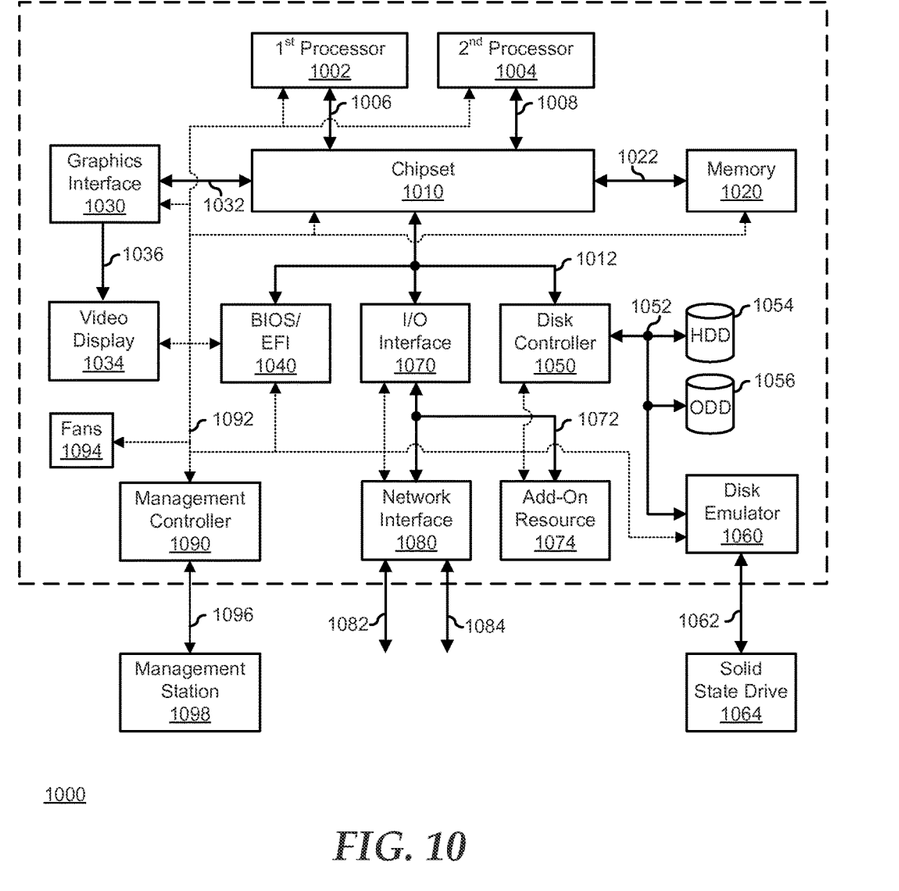
FIG. 10 is a block diagram of a generalized information handling system according to an embodiment of the present disclosure.

FIG. 10 illustrates a generalized embodiment of information handling system 1000. For purpose of this disclosure information handling system 1000 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1000 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1000 can include processing resources for executing machine-executable code, such as a central processing unit (CPU), a programmable logic array (PLA), an embedded device such as a System-on-a-Chip (SoC), or other control logic hardware. Information handling system 1000 can also include one or more computer-readable medium for storing machine-executable code, such as software or data, for performing one or more of the methods described herein. Additional components of information handling system 1000 can include one or more storage devices that can store machine-executable code, one or more communications ports for communicating with external devices, and various input and output (I/O) devices, such as a keyboard, a mouse, and a video display. Information handling system 1000 can also include one or more buses operable to transmit information between the various hardware components, and can include devices or modules that embody one or more of the devices or modules described above, and operates to perform one or more of the methods described above.

Information handling system 1000 includes a processors 1002 and 1004, a chipset 1010, a memory 1020, a graphics interface 1030, a basic input and output system—extensible firmware interface (BIOS/EFI) module 1040, a disk controller 1050, a disk emulator 1060, an input/output (I/O) interface 1070, a network interface 1080, and a management controller 190. Processor 1002 is connected to chipset 1010 via processor interface 1006, and processor 1004 is connected to the chipset via processor interface 1008. Memory 1020 is connected to chipset 1010 via a memory bus 1022. Graphics interface 1030 is connected to chipset 1010 via a graphics interface 1032, and provides a video display output 1036 to a video display 1034. In a particular embodiment, information handling system 1000 includes separate memories that are dedicated to each of processors 1002 and 1004 via separate memory interfaces. An example of memory 1020 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 1040, disk controller 1050, and I/O interface 1070 are connected to chipset 1010 via an I/O channel 1012. An example of I/O channel 1012 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 1010 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 1040 includes BIOS/EFI code operable to detect resources within information handling system 1000, to provide drivers for the resources, initialize the resources, and access the resources. BIOS/EFI module 1040 includes code that operates to detect resources within information handling system 1000, to provide drivers for the resources, to initialize the resources, and to access the resources.

Disk controller 1050 includes a disk interface 1052 that connects the disc controller to a hard disk drive (HDD) 1054, to an optical disk drive (ODD) 1056, and to disk emulator 1060. An example of disk interface 1052 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1060 permits a solid-state drive 1064 to be connected to information handling system 1000 via an external interface 1062. An example of external interface 1062 includes a USB interface, an IEEE 1394 (Firewire) interface, a proprietary interface, or a combination thereof. Alternatively, solid-state drive 1064 can be disposed within information handling system 1000.

I/O interface 1070 includes a peripheral interface 1072 that connects the I/O interface to an add-on resource 1074 and to network interface 1080. Peripheral interface 1072 can be the same type of interface as I/O channel 1012, or can be a different type of interface. As such, I/O interface 1070 extends the capacity of I/O channel 1012 when peripheral interface 1072 and the I/O channel are of the same type, and the I/O interface translates information from a format suitable to the I/O channel to a format suitable to the peripheral channel 1072 when they are of a different type. Add-on resource 1074 can include a data storage system, an additional graphics interface, a network interface card (NIC), a sound/video processing card, another add-on resource, or a combination thereof. Add-on resource 1074 can be on a main circuit board, on separate circuit board or add-in card disposed within information handling system 1000, a device that is external to the information handling system, or a combination thereof.

Network interface 1080 represents a NIC disposed within information handling system 1000, on a main circuit board of the information handling system, integrated onto another component such as chipset 1010, in another suitable location, or a combination thereof. Network interface device 1080 includes network channels 1082 and 1084 that provide interfaces to devices that are external to information handling system 1000. In a particular embodiment, network channels 1082 and 1084 are of a different type than peripheral channel 1072 and network interface 1080 translates information from a format suitable to the peripheral channel to a format suitable to external devices. An example of network channels 1082 and 1084 includes InfiniBand channels, Fibre Channel channels, Gigabit Ethernet channels, proprietary channel architectures, or a combination thereof. Network channels 1082 and 1084 can be connected to external network resources (not illustrated). The network resource can include another information handling system, a data storage system, another network, a grid management system, another suitable resource, or a combination thereof.

Management controller 1090 is connected to the components of information handling system 1000 via a system communication bus 1092. Management controller 1090 operates to control system fans 1094 as described above. Management controller 1090 may be on a main circuit board (such as a baseboard, a motherboard, or a combination thereof), integrated onto another component such as chipset 1010, in another suitable location, or a combination thereof. Management controller 1090 can be part of an integrated circuit or a chip set within information handling system 1000. An example of management controller 1090 includes a baseboard management controller (BMC), an integrated Dell remote access controller (iDRAC), a chassis management controller (CMC), another controller, or a combination thereof. An example of system communication bus 1092 includes an inter-integrated circuit (I²C) bus, a system management bus (SMBus), a serial peripheral interface (SPI) bus, a low pin count (LPC) bus, another bus, or a combination thereof.

Management controller 1090 is connected via a network channel 1096 to a management system 1098 that is external to information handling system 1000. Management system 1098 operates in conjunction with management controller 1090 to provide out-of-band management of information handling system 1000. Commands, communications, or other signals are communicated between management controller 1090 and management system 1098 to monitor status of information handling system 1000, to control the operations of the resources of the information handling system, and to update the resources. In a particular embodiment, management controller 1090 is powered by a separate power plane in information handling system 1000, so that the management controller can be operated while other portions of the information handling system are powered off. In another embodiment, management controller 1090 is operated during boot of information handling system 1000.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A fan for an information handling system, the fan comprising:
    a speed sensor;
    a temperature sensor at an outlet of the fan;
    a power sensor; and
    a processor configured to:
        receive inlet temperature information from the information handling system;
        determine a rise in temperature at the outlet of the fan based upon the inlet temperature information and outlet temperature information from the sensor;
        determine a usage level as:

$$\text{Usage} = \sum_0^N \left( \frac{RPM}{60 \frac{\text{sec}}{\text{min}}} \times \frac{T_{Inlet} + T_{Rise}}{60° \text{ C.}} \right)$$

where N is the time since the fan was new in seconds, RPM is a speed of the fan in revolutions per minute, as determined by the speed sensor, $T_{Inlet}$ is a temperature at the inlet of the fan, as determined by the inlet temperature information, and $T_{Rise}$ is the rise in temperature from the inlet to the outlet of the fan; and
        determine an efficiency level of the fan based upon efficiency information provided by the power sensor.

2. The fan of claim 1, wherein the processor is further operable to determine that the usage level of the fan is above a usage threshold level.

3. The fan of claim 2, wherein the processor is further operable to provide an indication to a management controller that the usage level is above the usage threshold level.

4. The fan of claim 1, wherein the processor is further operable to determine that the efficiency level of the fan is below an efficiency threshold level.

5. The fan of claim 4, wherein the processor is further operable to provide an indication to a management controller that the efficiency level is below the efficiency threshold level.

6. The fan of claim 1, further comprising:
    a persistent read-writable memory;
    wherein the processor is further operable to:
        receive identification information from a management controller; and
        store the identification information in the memory.

7. The fan of claim 6, wherein the identification information includes at least one of a unique identifier for the fan, an efficiency level of the fan, and a usage level of the fan.

8. The fan of claim 1, wherein the processor is further operable to provide an indication to swap the fan with another fan of the information handling system based upon the usage level of the fan.

9. The fan of claim 1, wherein the processor is further operable to provide an indication to swap the fan with another fan of the information handling system based upon the efficiency level of the fan.

10. A method comprising:
    determining, by a speed sensor of a fan, speed information for the fan;
    receiving, from an information handling system, inlet temperature information for a temperature at an inlet of the fan;

determining a rise in temperature at an outlet of the fan based upon the inlet temperature information and outlet temperature information from a temperature sensor of the fan; and determining a usage level as:

$$\text{Usage} = \sum_{0}^{N} \left( \frac{RPM}{60\frac{\text{sec}}{\text{min}}} \times \frac{T_{Inlet} + T_{Rise}}{60° \text{ C.}} \right)$$

where N is the time since the fan was new in seconds, RPM is a speed of the fan in revolutions per minute, as determined by the speed sensor, is a temperature at the inlet of the fan, as determined by the inlet temperature information, and $T_{Inlet}$ is the rise in temperature from the inlet to the outlet of the fan; and determining, by the processor, an efficiency level of the fan based upon efficiency information provided by a power sensor of the fan.

11. The method of claim 10, further comprising:
determining, by the processor, that the usage level of the fan is above a usage threshold level.

12. The method of claim 11, further comprising:
providing, by the processor, an indication to a management controller that the usage level is above the usage threshold level.

13. The method of claim 10, further comprising:
determining, by the processor, that the efficiency level of the fan is below an efficiency threshold level.

14. The method of claim 13, further comprising:
providing, by the processor, an indication to a management controller that the efficiency level is below the efficiency threshold level.

15. The method of claim 10, further comprising:
receiving, by the processor, identification information from a management controller; and storing, by the processor, the identification information in a persistent read-writable memory of the fan.

16. The method of claim 15, wherein the identification information includes at least one of a unique identifier for the fan, an efficiency level of the fan, and a usage level of the fan.

17. The method of claim 10, further comprising:
providing, by the processor, an indication to swap the fan with another fan of the information handling system based upon the efficiency level of the fan.

18. A non-transitory computer-readable medium including code for performing a method, the method comprising:
determining, by a speed sensor of a fan, speed information for the fan;

determining, by a processor of the fan, a usage level of the fan based upon speed information;

receiving, from an information handling system, inlet temperature information for a temperature at an inlet of the fan;

determining a rise in temperature at an outlet of the fan based upon the inlet temperature information and outlet temperature information from a temperature sensor of the fan; and determining the usage level as:

$$\text{Usage} = \sum_{0}^{N} \left( \frac{RPM}{60\frac{\text{sec}}{\text{min}}} \times \frac{T_{Inlet} + T_{Rise}}{60° \text{ C.}} \right)$$

where N is the time since the fan was new in seconds, RPM is a speed of the fan in revolutions per minute, as determined by the speed information, $T_{Inlet}$ is a temperature at the inlet of the fan, as determined by the inlet temperature information, and $T_{Rise}$ is the rise in temperature from the inlet to the outlet of the fan, as determined by the outlet temperature information.

* * * * *